United States Patent
Nemoto et al.

(10) Patent No.: US 6,734,084 B1
(45) Date of Patent: May 11, 2004

(54) METHOD OF MANUFACTURING A SEMICONDUCTOR DEVICE WITH RECESSES USING ANODIC OXIDE

(75) Inventors: Yoshihiko Nemoto, Tokyo (JP); Masataka Hoshino, Kanagawa (JP); Hitoshi Yonemura, Tokyo (JP)

(73) Assignees: Mitsubishi Denki Kabushiki Kaisha, Tokyo (JP); Sony Corporation, Tokyo (JP); Fujitsu Limited, Kanagawa (JP)

( * ) Notice: Subject to any disclaimer, the term of this patent is extended or adjusted under 35 U.S.C. 154(b) by 0 days.

(21) Appl. No.: 10/603,982

(22) Filed: Jun. 26, 2003

(30) Foreign Application Priority Data

Feb. 4, 2003 (JP) ........................................ 2003-027112

(51) Int. Cl.⁷ ..................... H01L 21/326; H01L 21/479
(52) U.S. Cl. ..................... 438/466; 438/620; 438/667; 438/928; 438/977
(58) Field of Search .................. 438/408, 430–432, 438/466, 469, 599, 620, 631, 633, 666–667, 690–693, 719, 735, 738, 750–751, 753, 756, 762, 769–774, 787–788, 928, 959, 977

(56) References Cited

U.S. PATENT DOCUMENTS

| | | | | |
|---|---|---|---|---|
| 5,424,245 A | * | 6/1995 | Gurtler et al. | ............ 438/107 |
| 5,946,600 A | * | 8/1999 | Hurwitz et al. | ............ 438/738 |
| 6,331,208 B1 | * | 12/2001 | Nishida et al. | ............ 438/773 |
| 6,605,551 B2 | * | 8/2003 | Wermer et al. | ............ 438/778 |
| 2003/0082851 A1 | * | 5/2003 | Van Hoff | ............ 438/107 |
| 2003/0203623 A1 | * | 10/2003 | Coomer | ............ 438/667 |

FOREIGN PATENT DOCUMENTS

JP       2001053218       *   2/2001

* cited by examiner

Primary Examiner—Lynne Gurley
(74) Attorney, Agent, or Firm—McDermott, Will & Emery

(57) ABSTRACT

A method for manufacturing a semiconductor device is capable of controlling amounts of protrusion of penetration electrodes (5) from a rear surface of a semiconductor substrate (4) in a easy and accurate manner. Recesses (7) are formed in a substrate proper (6) that has a semiconductor circuit (2) formed on one surface thereof, and an insulation film (8) is formed on an inner wall surface of each of the recesses (7). A conductive material is filled into the recesses (7) through the insulation films (8) to form embedded electrodes (15) that constitute the penetration electrodes (5). A rear side of the substrate proper (6) is re moved until one end face of each of the embedded electrodes (15) is exposed, thereby to form the penetration electrodes (5). The rear surface of the substrate proper (6) is anodized to form an anodic oxide film (9), which is then removed by etching to form the semiconductor substrate (4).

5 Claims, 2 Drawing Sheets

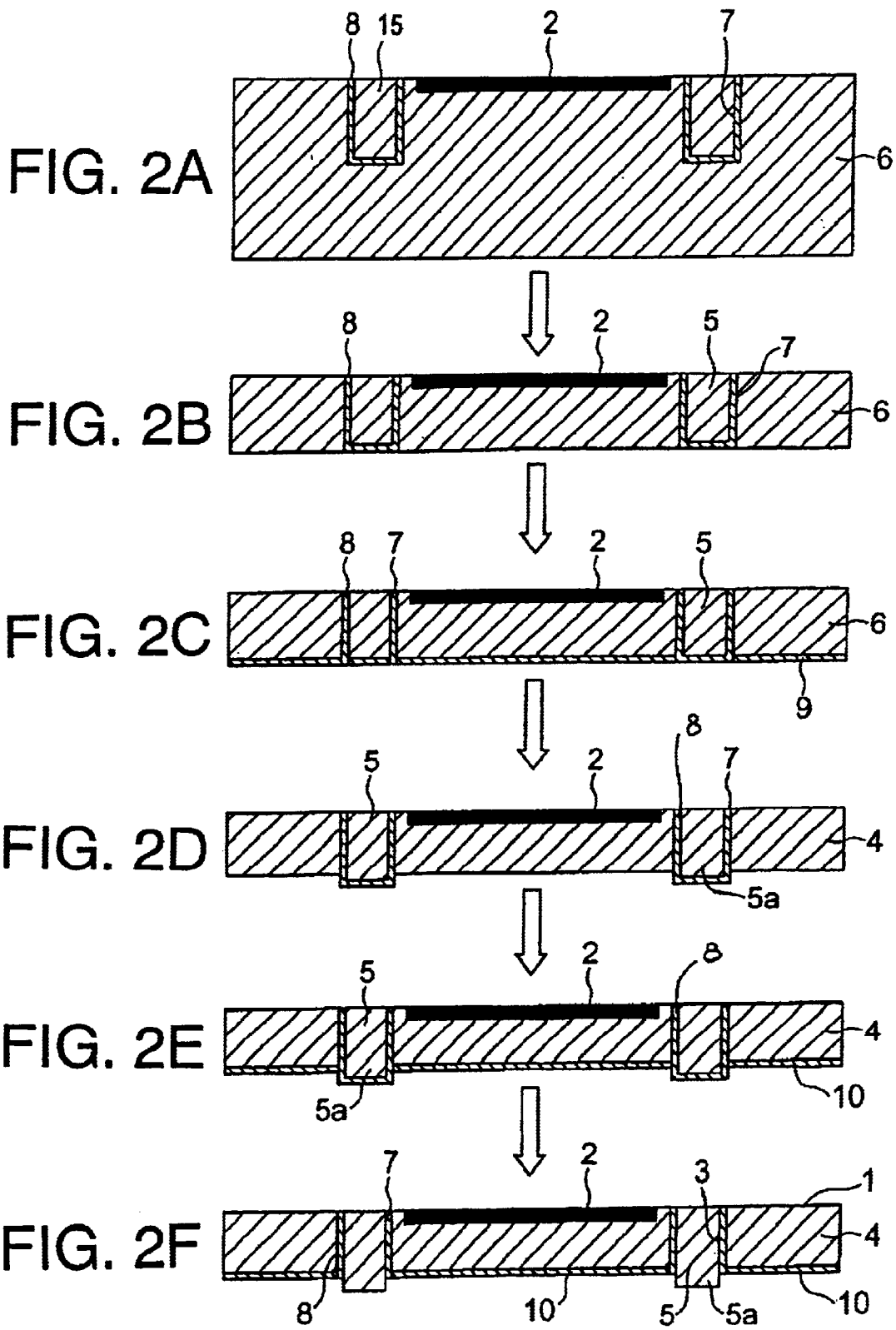

METHOD OF MANUFACTURING A SEMICONDUCTOR DEVICE WITH RECESSES USING ANODIC OXIDE

BACKGROUND OF THE INVENTION

1. Field of the Invention

The present invention relates to a method for manufacturing a semiconductor device which includes a semiconductor substrate having a semiconductor circuit on a principal plane thereof, with through holes extending through the semiconductor substrate from the principal plane toward a rear surface thereof, and penetration electrodes formed in the through holes with their one ends protruded from the rear surface of the semiconductor substrate.

2. Description of the Related Art

In the past, a known semiconductor device with penetration electrodes has been manufactured in the following procedure.

First, recesses are formed in a substrate main body or substrate proper having a semiconductor circuit on one surface thereof, and then insulation films are formed on inner wall surfaces of the recesses. Thereafter, a conductive material is embedded into the recesses through the insulation films to form embedded electrodes which later constitute penetration electrodes.

Subsequently, the rear surface of the substrate proper is ground up to the bottom of each recess, i.e., until one end faces of the embedded electrodes are exposed from the rear surface, thereby forming the penetration electrodes. Then, the rear surface of the substrate proper is removed by means of etching so that the penetration electrodes are protruded from the rear surface of the substrate proper to form a thinned semiconductor substrate. Thereafter, an insulation film is deposited on the entire rear surface of the semiconductor substrate and the one end faces of the penetration electrodes.

Finally, the insulation film covering the end faces of the penetration electrodes is removed (for instance, see a first patent document: Japanese patent laid-open No. 2001-53218).

The above-mentioned method for manufacturing a semiconductor device involves the following problem. That is, it is necessary to protrude the one end portions of the penetration electrodes from the rear surface of the substrate proper by etching the substrate proper made of silicon. Therefore, in the case of using dry etching to this end, it is difficult to uniformly etch the rear surface of the substrate proper since contamination of the substrate proper due to grinding thereof in a preceding process step or the like would greatly influence the surface condition of the substrate proper. As a result, a special process is required for removing such contamination.

On the other hand, in the case of using wet etching, there arises another problem in that when the rear surface of the substrate proper made of silicon is continuously etched, it is difficult to exactly stop the etching at a prescribed amount of etching. Accordingly, it is difficult to control the amounts of protrusion of the penetration electrodes from the rear surface of the substrate proper in a precise manner.

In addition, after an insulation film is deposited on the entire rear surface of the semiconductor substrate and the end faces of the penetration electrodes, a process step of finally removing those portions of the insulation film which cover the end faces of the penetration electrodes is separately needed, and hence the semiconductor device manufacturing procedure as a whole is accordingly complicated.

SUMMARY OF THE INVENTION

The present invention is intended to obviate the various problems as referred to above, and has for its object to provide a method for manufacturing a semiconductor device in which it is easy to control the amounts of protrusion of penetration electrodes from a rear surface of a substrate proper in a precise manner.

According to one aspect, the present invention resides in a method for manufacturing a semiconductor device which includes a semiconductor substrate having a semiconductor circuit on a principal plane thereof, with through holes extending through the semiconductor substrate from the principal plane toward a rear surface thereof, and penetration electrodes formed in the through holes with their one ends protruded from the rear surface of the semiconductor substrate. The method includes: a recess forming step of forming recesses in a substrate proper that has the semiconductor circuit formed on one surface thereof; an insulation film forming step of forming an insulation film on an inner wall surface of each of the recesses; an embedded electrode forming step of filling a conductive material into the recesses through the insulation films to form embedded electrodes that constitute the penetration electrodes; a penetration electrode forming step of forming the penetration electrodes by removing a rear side of the substrate proper opposite to the one surface thereof until one end face of each of the embedded electrodes is exposed; an anodic oxide film forming step of anodizing the rear surface of the substrate proper to form an anodic oxide film; and a semiconductor substrate forming step of forming the semiconductor substrate by removing the anodic oxide film (9) by means of etching.

According to another aspect, the present invention resides in a method for manufacturing a semiconductor device which includes a semiconductor substrate having a semiconductor circuit on a principal plane thereof, with through holes extending through the semiconductor substrate from the principal plane toward a rear surface thereof, and penetration electrodes formed in the through holes with their one ends protruded from the rear surface of the semiconductor substrate. The method includes: a recess forming step of forming recesses in a substrate proper that has the semiconductor circuit formed on one surface thereof; an insulation film forming step of forming an insulation film on an inner wall surface of each of the recesses; an embedded electrode forming step of filling a conductive material into the recesses through the insulation films to form embedded electrodes that constitute the penetration electrodes; a removal step of removing a rear side of the substrate proper opposite to the one surface thereof until one end face of each of the embedded electrodes is exposed; an anodic oxide film forming step of anodizing the rear surface of the substrate proper to form an anodic oxide film; a semiconductor substrate forming step of removing the anodic oxide film by means of etching to form the penetration electrodes and the thinned semiconductor substrate; and a removal step of removing the insulation films which cover one end portions of the penetration electrodes.

The above and other objects, features and advantages of the present invention will become more readily apparent to those skilled in the art from the following detailed description of preferred embodiments of the present invention taken in conjunction with the accompanying drawings.

BRIEF DESCRIPTION OF THE DRAWINGS

FIGS. 2A through 2F are cross sectional views of a semiconductor device in the respective process steps of a semiconductor device manufacturing method according to a second embodiment of the present invention.

DESCRIPTION OF THE PREFERRED EMBODIMENTS

Figure 1A:
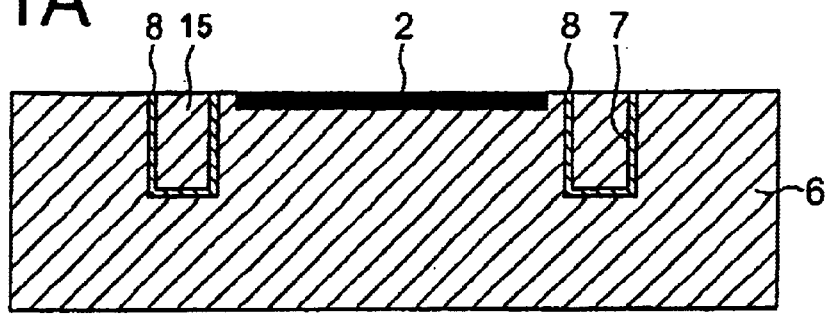
FIGS. 1A through 1E are cross sectional views of a semiconductor device in the respective process steps of a semiconductor device manufacturing method according to a first embodiment of the present invention.

Now, preferred embodiments of the present invention will be described below in detail while referring to the accompanying drawings. Embodiment 1.

FIGS. 1A through 1E show a semiconductor device in the respective process steps of a semiconductor device manufacturing method in accordance with a first embodiment of the present invention.

The semiconductor device illustrated in these figures includes: a semiconductor substrate 4 that has a semiconductor circuit 2 formed on a principal plane or one surface thereof, and through holes 3 extending through the semiconductor substrate 4 from the principal plane to a rear surface thereof; penetration electrodes 5 that are formed in the through holes 3 with their protruded portions 5a being protruded from the rear surface of the semiconductor substrate 4; insulation films 8 in the form of silicon nitride films formed to cover the peripheral surfaces of the penetration electrodes 5; and an anodic oxide film 10 in the form of an insulation film formed on the entire area of the rear surface of the semiconductor substrate 4.

This semiconductor device is produced according to the following procedure.

First, recesses 7 are formed in a substrate proper 6 which is made of silicon or monocrystalline composed of silicon as its principal component and which has the semiconductor circuit 2 formed on one surface thereof. Then, the insulation films 8 in the form of silicon nitride films are formed on the inner wall surfaces of the recesses 7. Thereafter, a conductive material is filled or embedded into the recesses 7 through the insulation films 8, thus forming embedded electrodes 15 which constitute the penetration electrodes 5 (see FIG. 1A).

Figure 1B:
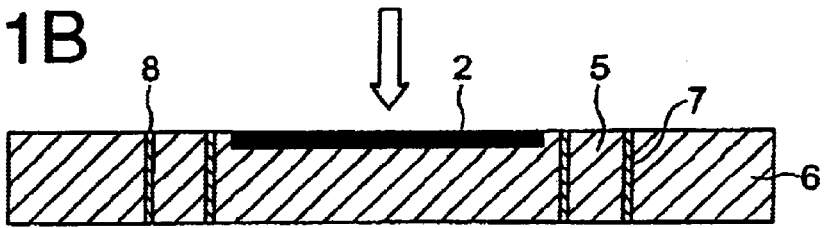

Then, the rear side of the substrate proper 6 is removed until one end faces of the embedded electrodes 15 are exposed, thereby to form the penetration electrodes 5 (see FIG. 1B). The method of removing the rear side of the substrate proper 6 may be any of mechanical grinding, chemical mechanical polishing, and etching, or any combinations thereof.

Figure 1C:
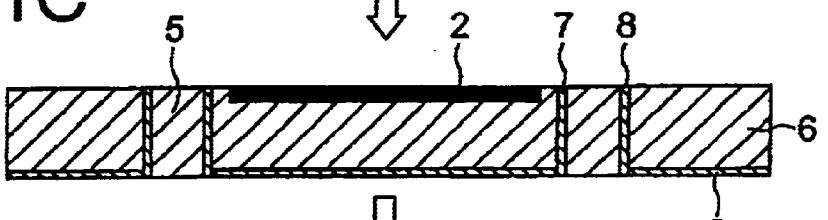

Thereafter, the rear surface of the substrate proper 6 is anodized to form an anodic oxide film 9 that is made of silicon dioxide (see FIG. 1C).

Subsequently, the anodic oxide film 9 is removed by means of wet etching, whereby the penetration electrodes 5 are protruded from the rear surface of the substrate proper 6 to provide the protruded portions 5a and a thinned semiconductor substrate 4 (see FIG. 1D). At this time, the amount of protrusion of each protruded portion 5a that protrudes from the rear surface of the semiconductor substrate 4 is adjusted by repeatedly performing the formation of the anodic oxide film 9 and the removal of the anodic oxide film 9.

Figure 1D:
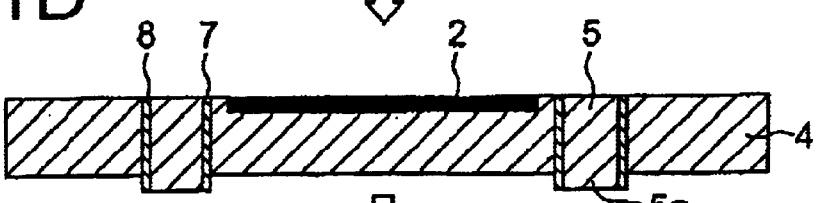
Figure 1E:
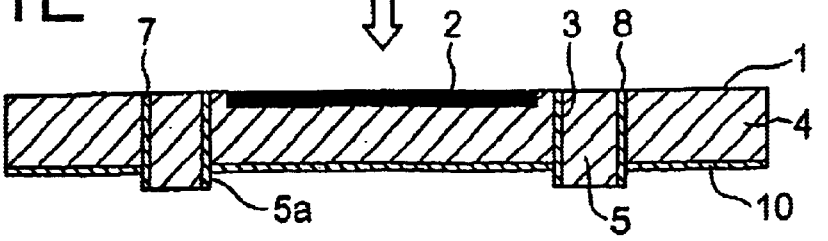

Finally, the entire rear surface of the semiconductor substrate 4 is anodized to form the anodic oxide film 10 (see FIG. 1E).

According to the method for manufacturing a semiconductor device as described above, the rear surface of the substrate proper 6 is anodized to provide the anodic oxide film 9, as shown in FIG. 1C. However, in this anodizing process, by applying an appropriate voltage to the substrate proper 6 made of silicon, and by selecting an appropriate chemical liquid, there is formed substantially no oxide film on the exposed end faces of the penetration electrodes 5 at the rear side thereof, but the anodic oxide film 9 made of silicon dioxide is formed only on the rear surface of the silicon substrate proper 6.

The anodic oxide film 9 obtained at this time generally tends to be poor in its film quality and density as compared with thermal oxide films of silicon. This tendency can be easily strengthened by properly selecting the anodizing conditions such as the voltage applied, etc. The anodic oxide film 9 thus obtained can generally be etched at fast speed and removed with ease.

In addition, the thickness of the anodic oxide film 9 formed of silicon dioxide is constant from the surface thereof, and the etching stops at the rear surface of the semiconductor substrate 4 in the form of a silicon surface by properly selecting an etchant. As a result, the etching thickness becomes constant, and hence the amounts of protrusion of the protruded portions 5a of the penetration electrodes 5 can be controlled to be constant.

Moreover, the insulation films 8 are formed of silicon nitride films, so that when the anodic oxide film 9 is removed, the silicon nitride films remain without being etched, as shown in FIG. 1D. Accordingly, the insulation films 8 finally remain on the side walls of the protruded portions 5a, thereby improving their electrical insulation.

Further, the anodic insulation or oxide film 10 is finally formed by anodizing the entire rear surface of the semiconductor substrate 4. As a result, further improvements in electrical insulation and chemical stability can be attained.

Here, note that the anodic insulation film 10 formed at this time is different from the anodic oxide film 9 which serves to form the protruded portions 5a of the penetration electrodes 5, but a satisfactorily good and dense film quality of the anodic insulation film 10, though not equivalent to that of thermal oxide films, can be obtained by changing the anodizing conditions. Embodiment 2.

FIGS. 2A through 2F show a semiconductor device in the respective process steps of a semiconductor device manufacturing method in accordance with a second embodiment of the present invention.

Although in the semiconductor device according to the first embodiment, the side surface of the protruded portion 5a of each penetration electrode 5 is coated with an insulation film 8, the side surface of the protruded portion 5a of each penetration electrode 5 in the semiconductor device of this second embodiment is exposed, but the construction of this embodiment other than this is similar to that of the first embodiment.

The semiconductor device according to this second embodiment is produced according to the following procedure.

First, recesses 7 are formed in a substrate proper 6 which is made of silicon and which has a semiconductor circuit 2 formed on one surface thereof, and insulation films 8 in the form of silicon nitride films are formed on the inner wall surfaces of the recesses 7. Thereafter, a conductive material is filled or embedded into the recesses 7 through the insulation films 8 to form embedded electrodes 15 (see FIG. 2A).

Then, the rear side of the substrate proper 6 is removed to such an extent as just before the bottom of each recess 7 is reached (see FIG. 2B). The method of removing the rear side of the substrate proper 6 may be any of mechanical grinding, chemical mechanical polishing, and etching, or any combinations thereof.

Thereafter, the rear surface of the substrate proper 6 is anodized to form an anodic oxide film 9 that is made of silicon dioxide (see FIG. 2C).

Subsequently, the anodic oxide film 9 is removed by means of wet etching, whereby the penetration electrodes 5 are formed, and a thinned semiconductor substrate 4 is also formed. At this time, the amount of protrusion of each protruded portion 5a that protrudes from the rear surface of the semiconductor substrate 4 is adjusted by repeatedly performing the formation of the anodic oxide film 9 and the removal of the anodic oxide film 9 (see FIG. 2D).

After this, the entire rear surface of the semiconductor substrate 4 is anodized to form an anodic oxide film 10 (see FIG. 2E).

Finally, the insulation films 8 covering the end portions of the penetration electrodes 5 are removed (see FIG. 2F).

In this second embodiment, when the substrate proper 6 and the rear surface of the semiconductor substrate 4 are anodized, the end faces of the penetration electrodes 5 are covered with the insulation films 8 in the form of silicon nitride films. Therefore, there will be caused neither oxidation nor corrosion in the protruded portions 5a of the penetration electrodes 5.

In addition, when the insulation films 8 coating the protruded portions 5a of the penetration electrodes 5 are removed, the entire area of the rear surface of the semiconductor substrate 4 has already been covered with the anodic insulation film 10. Thus, there is no influence on the rear side of the semiconductor substrate 4 due to the removal of the insulation films 8.

Moreover, similar to the first embodiment, the anodic insulation film 10 is formed over the entire rear surface of the semiconductor substrate 4, further improvements in electrical insulation and chemical stability can be attained.

Furthermore, since the end face and the side surface of each penetration electrode 5 are exposed at its protruded portion 5a, the electrical connectivity of the penetration electrodes 5 can be improved. In particular, such improved connectivity is effective for connections due to fitting engagement.

What is claimed is:

1. A method for manufacturing a semiconductor device which includes a semiconductor substrate having a semiconductor circuit on a principal plane thereof, with through holes extending through said semiconductor substrate from said principal plane toward a rear surface thereof, and penetration electrodes formed in said through holes with their one ends protruded from the rear surface of said semiconductor substrate, said method comprising:
a recess forming step of forming recesses in a substrate proper that has said semiconductor circuit formed on one surface thereof;
an insulation film forming step of forming an insulation film on an inner wall surface of each of said recesses;
an embedded electrode forming step of filling a conductive material into said recesses through said insulation films to form embedded electrodes that constitute said penetration electrodes;
a penetration electrode forming step of forming said penetration electrodes by removing a rear side of said substrate proper opposite to said one surface thereof until one end face of each of said embedded electrodes is exposed;
an anodic oxide film forming step of anodizing the rear surface of said substrate proper to form an anodic oxide film; and
a semiconductor substrate forming step of forming said semiconductor substrate by removing said anodic oxide film by means of etching.

2. A method for manufacturing a semiconductor device which includes a semiconductor substrate having a semiconductor circuit on a principal plane thereof, with through holes extending through said semiconductor substrate from said principal plane toward a rear surface thereof, and penetration electrodes formed in said through holes with their one ends protruded from the rear surface of said semiconductor substrate, said method comprising:
a recess forming step of forming recesses in a substrate proper that has said semiconductor circuit formed on one surface thereof;
an insulation film forming step of forming an insulation film on an inner wall surface of each of said recesses;
an embedded electrode forming step of filling a conductive material into said recesses through said insulation films to form embedded electrodes that constitute said penetration electrodes;
a removal step of removing a rear side of said substrate proper opposite to said one surface thereof until one end face of each of said embedded electrodes is exposed;
an anodic oxide film forming step of anodizing the rear surface of said substrate proper to form an anodic oxide film;
a semiconductor substrate forming step of removing said anodic oxide film by means of etching to form said penetration electrodes and a thinned semiconductor substrate; and
a removal step of removing said insulation films which cover one end portions of said penetration electrodes.

3. The method for manufacturing a semiconductor device as set forth in claim 1, wherein said anodic oxide film forming step of anodizing the rear surface of said substrate proper to form said anodic oxide film and said removal step of removing said anodic oxide film by means of etching are repeated a plurality of times.

4. The method for manufacturing a semiconductor device as set forth in claim 1, wherein the rear side of said semiconductor substrate is further anodized to form an anodic insulation film after said removal step of removing said anodic oxide film by means of etching.

5. The method for manufacturing a semiconductor device as set forth in claim 1, wherein said semiconductor substrate is made of silicon or monocrytalline composed of silicon as its principal component, and said insulation films comprise silicon nitride films.

* * * * *